United States Patent
Kawagoshi (10) Patent No.: US 9,093,964 B2
(45) Date of Patent: Jul. 28, 2015

(54) DIFFERENTIAL AMPLIFIER AND CONTROL METHOD FOR THE SAME

(75) Inventor: Hirokazu Kawagoshi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 1215 days.

(21) Appl. No.: 12/963,056

(22) Filed: Dec. 8, 2010

(65) Prior Publication Data

US 2011/0141092 A1   Jun. 16, 2011

(30) Foreign Application Priority Data

Dec. 10, 2009   (JP) ................. 2009-280706

(51) Int. Cl.
  *G09G 5/00*   (2006.01)
  *H03F 3/45*   (2006.01)
  *G09G 3/36*   (2006.01)

(52) U.S. Cl.
  CPC ......... *H03F 3/45179* (2013.01); *G09G 3/3688* (2013.01); *G09G 2310/0291* (2013.01); *H03F 2203/45248* (2013.01); *H03F 2203/45648* (2013.01)

(58) Field of Classification Search
  CPC ............... H03K 19/00315; H03K 3/45179; H03K 2203/45248; H03K 2203/45648; G09G 3/3688; G09G 2310/0291
  USPC ........... 326/24, 45, 50, 58, 68, 69, 83, 97, 98, 326/102, 103, 109, 110, 112, 119, 122; 345/87, 211
  See application file for complete search history.

(56) References Cited

U.S. PATENT DOCUMENTS

| | | | | |
|---|---|---|---|---|
| 6,081,134 A * | 6/2000 | Labram | | 326/83 |
| 6,392,485 B1 | 5/2002 | Doi et al. | | |
| 7,193,443 B1 * | 3/2007 | Smith et al. | | 326/83 |
| 7,830,167 B2 * | 11/2010 | Ono et al. | | 326/27 |

FOREIGN PATENT DOCUMENTS

| | | |
|---|---|---|
| JP | 64-088494 A | 4/1989 |
| JP | 2001-156559 A | 6/2001 |
| JP | 2003-142962 A | 5/2003 |
| JP | 2006-54628 A | 2/2006 |

* cited by examiner

*Primary Examiner* — Amr Awad
*Assistant Examiner* — Aaron Midkiff
(74) *Attorney, Agent, or Firm* — Foley & Lardner LLP (57) ABSTRACT

A liquid crystal display apparatus includes a signal generating circuit configured to generate a first control signal and a second control signal; and a differential amplifier. The differential amplifier includes: a first differential pair of transistors configured to receive a differential input signal; a first constant current source connected with said first differential pair of transistors; and a first switch connected in parallel with said first constant current source and configured to increase current which flows through said first differential pair of transistors, in response to said first control signal which is active for a first time period in a level transition of said differential input signal.

13 Claims, 8 Drawing Sheets

DIFFERENTIAL AMPLIFIER AND CONTROL METHOD FOR THE SAME

INCORPORATION BY REFERENCE

This application claims a priority on convention based on Japanese Patent Application No. 2009-280706. The disclosure thereof is incorporated herein by reference.

TECHNICAL FIELD

The present invention is related to a differential amplifier of a high slew rate and a control method of the same.

BACKGROUND ART

In recent years, a liquid crystal display apparatus which is used for a television and a personal computer has been developed to have a large screen and a high definition. A source driver is required to drive a large load at a higher speed while suppressing consumed power. Also, many differential amplifiers have been mounted in the source driver. For this reason, the differential amplifier is required to operate with a high slew rate in a circuit area as small as possible.

Figure 1:
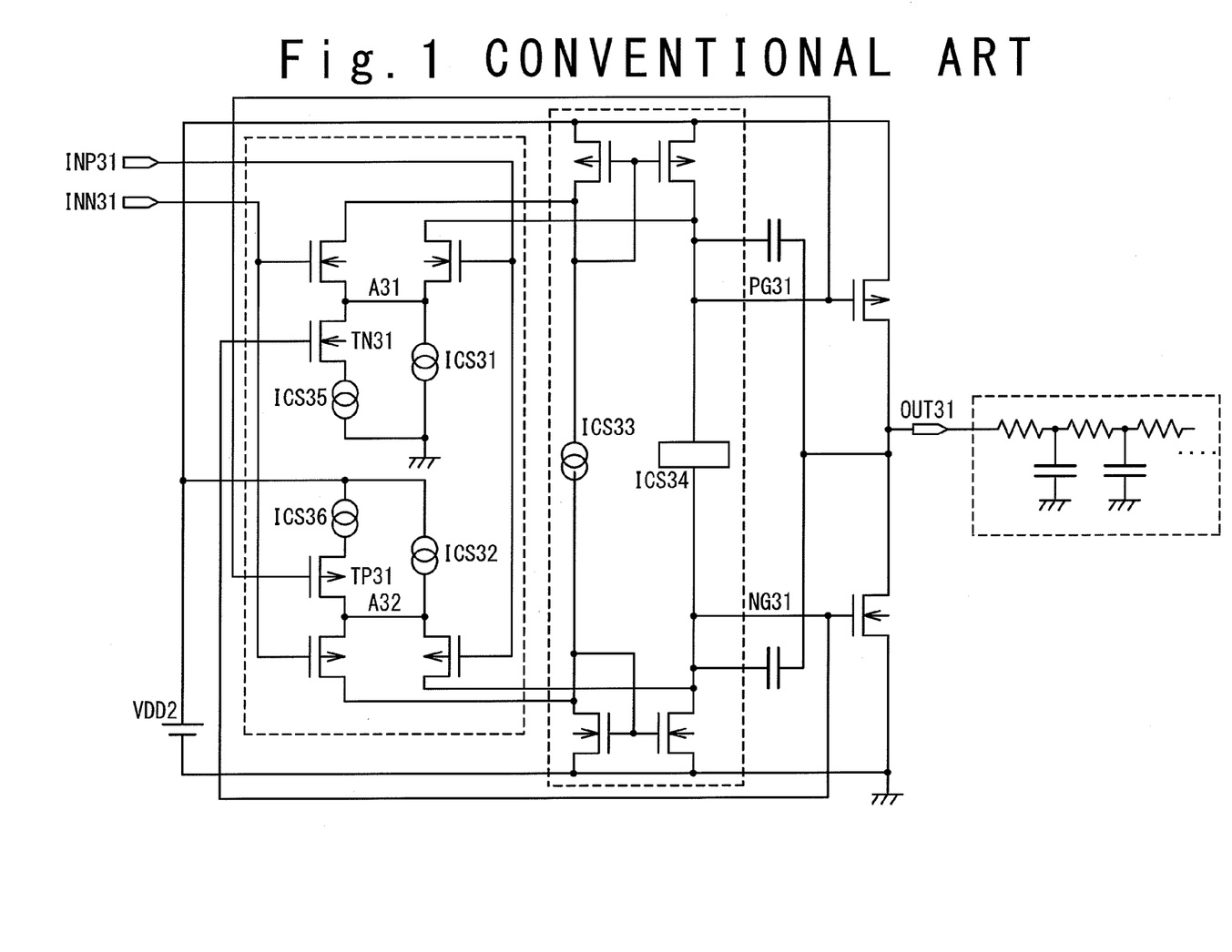
FIG. 1 is a circuit diagram showing a configuration of a conventional high slew rate differential amplifier.

For example, Japanese Patent Publication (JP 2001-156559A) discloses a circuit configuration and operation of the amplifier. As shown in FIG. 1, the high slew rate differential amplifier amplifies a differential input signal supplied to an amplifier positive input terminal INP31 and an amplifier negative input terminal INN31 and outputs the amplified result from an amplifier output terminal OUT31. When the amplifier is used as a source driver for a liquid crystal drive unit, the differential amplifier is used as a voltage follower-type amplifier having the gain of "1" by connecting the amplifier negative input terminal INN31 and the amplifier output terminal OUT31. When a voltage at the amplifier output terminal OUT31 is switched from a low voltage to a high voltage, a voltage at a node PG31 falls tentatively so as to turn on a transistor TP31. Thus, currents of the constant current sources ICS32 and ICS36 of an input differential stage are increased tentatively. Accordingly, the differential amplifier is set to a high slew rate. When the voltage at the amplifier output terminal OUT31 is switched from the high voltage to the low voltage, a voltage at the node NG31 is increased tentatively so as to turn on a transistor TN31. Thus, a current from a constant current source ICS35 is added to a current from a constant current source ICS31 and the current of the input differential stage increases tentatively. Accordingly, the differential amplifier is set to the high slew rate.

In this differential amplifier, when the voltage at the amplifier output terminal OUT is switched from the low voltage to the high voltage 31, the switching is sped up because the voltage at the node PG31 falls. However, because a time period for which the voltage at the node PG31 is set to the lower level is very long (tbp1 in (b) of FIG. 2: about 10 μs), the constant current of the differential input stage increases for the long time. For this reason, as shown in (d) of FIG. 2, a ringing waveform appears. Moreover, the differential input stage drags currents in a middle stage so that an oscillation operation is sometimes induced as an extraordinary operation.

Figure 2:
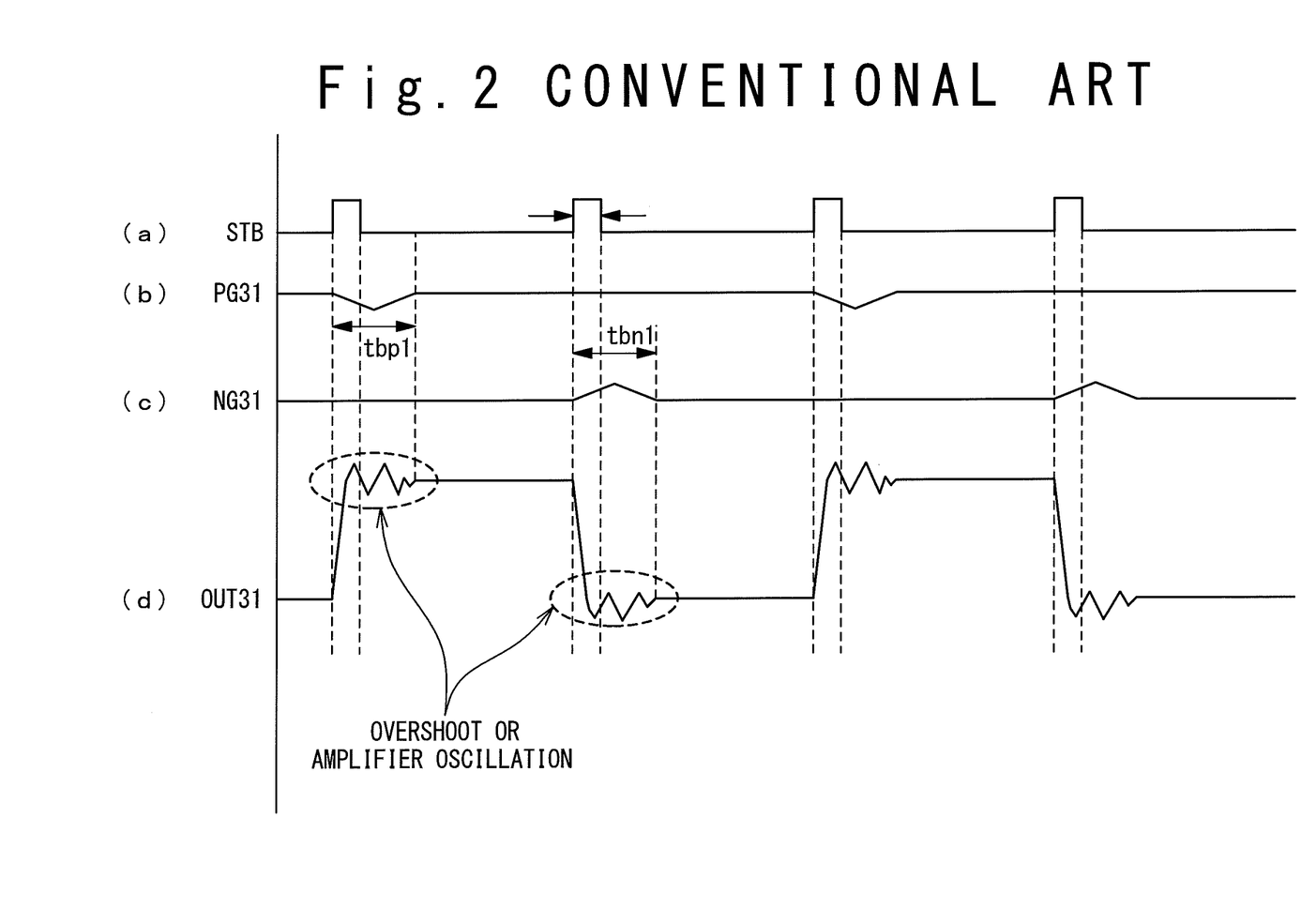
FIG. 2 shows voltage waveforms in various sections of the differential amplifier shown in FIG. 1.

The same operation as described above is carried out since the voltage at the node NG31 rises when the voltage at the amplifier output terminal OUT31 of the differential amplifier is switched from the high voltage to the low voltage. Moreover, because the differential amplifier returns to an ordinary operation after the switching operation, the gate voltages of the transistors TP31 and TN31 are such as the gate voltage of the transistor TP31≈VDD2-VTP and the gate voltage of the transistor TN31≈VTN. Because the transistors TP31 and TN31 must be set to an off state with such gate voltages left, the size (W/L) design of the transistors TP31 and TN31 becomes very difficult. Here, VTP and VTN are threshold voltages of the transistors TP31 and TN31, respectively.

CITATION LIST

[Patent Literature 1]: JP 2001-156559A

SUMMARY OF THE INVENTION

In an aspect of the present invention, a differential amplifier includes: a first differential pair of transistors configured to receive a differential input signal; a first constant current source connected with said first differential pair of transistors; and a first switch connected in parallel with said first constant current source and configured to increase current which flows through said first differential pair of transistors, in response to a first control signal which is active for a first time period in a level transition of said differential input signal.

In another aspect of the present invention, a liquid crystal display apparatus includes: a signal generating circuit configured to generate a first control signal and a second control signal; and a differential amplifier. The differential amplifier includes: a first differential pair of transistors configured to receive a differential input signal; a first constant current source connected with said first differential pair of transistors; and a first switch connected in parallel with said first constant current source and configured to increase current which flows through said first differential pair of transistors, in response to said first control signal which is active for a first time period in a level transition of said differential input signal.

In still another aspect of the present invention, a control method of a differential amplifier, is achieved by receiving a differential input signal by a first differential pair of transistors; by holding current which flows through said first differential pair of transistors at a constant current; and by increasing the current which flows through said first differential pair of transistors, in response to a first control signal which is active for a first time period in a level transition of said differential input signal.

According to the present invention, the differential amplifier stable in operation and having a high slew rate without ringing and oscillation is provided.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE EMBODIMENTS

Hereinafter, a differential amplifier of the present invention will be described with reference to the attached drawings.

Figure 3:
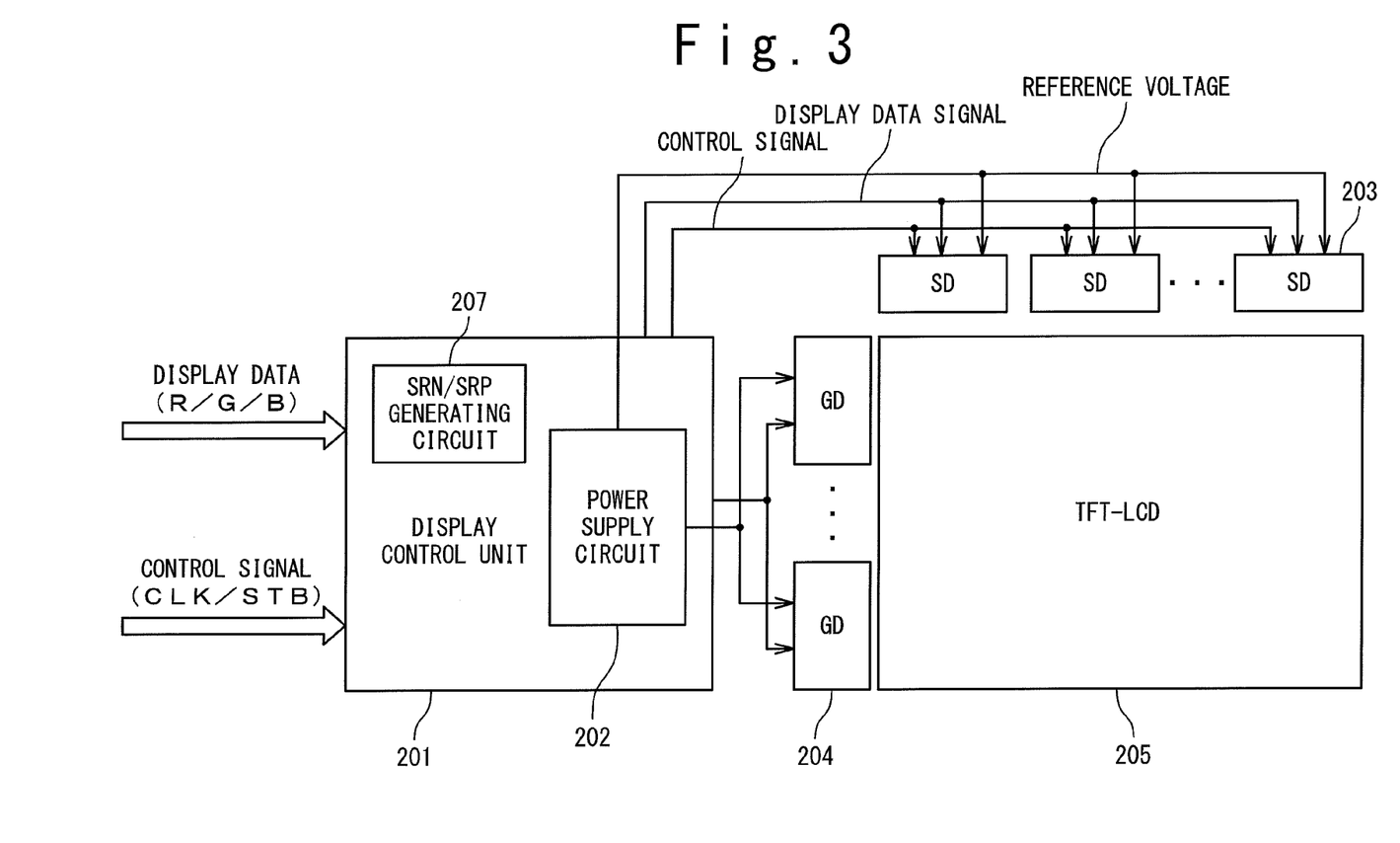
FIG. 3 is a block diagram showing a configuration of a liquid crystal display apparatus according to an embodiment of the present invention.

FIG. 3 is a block diagram showing a configuration of a liquid crystal display apparatus according to an embodiment of the present invention.

The liquid crystal display apparatus is provided with a display control unit 201, source drivers (SD) 203, gate drivers (GD) 204, and a liquid crystal panel (TFT-LCD: Thin Film Transistor-Liquid Cristal Display) 205. The liquid crystal display panel has pixels arranged in a matrix and displays an image. The display control unit 201 is provided with a power supply circuit 202 and a SRN/SRP generating circuit 207, and supplies a display data signal and a control signal to the source drivers 203 and the gate drivers 204.

Figure 4:
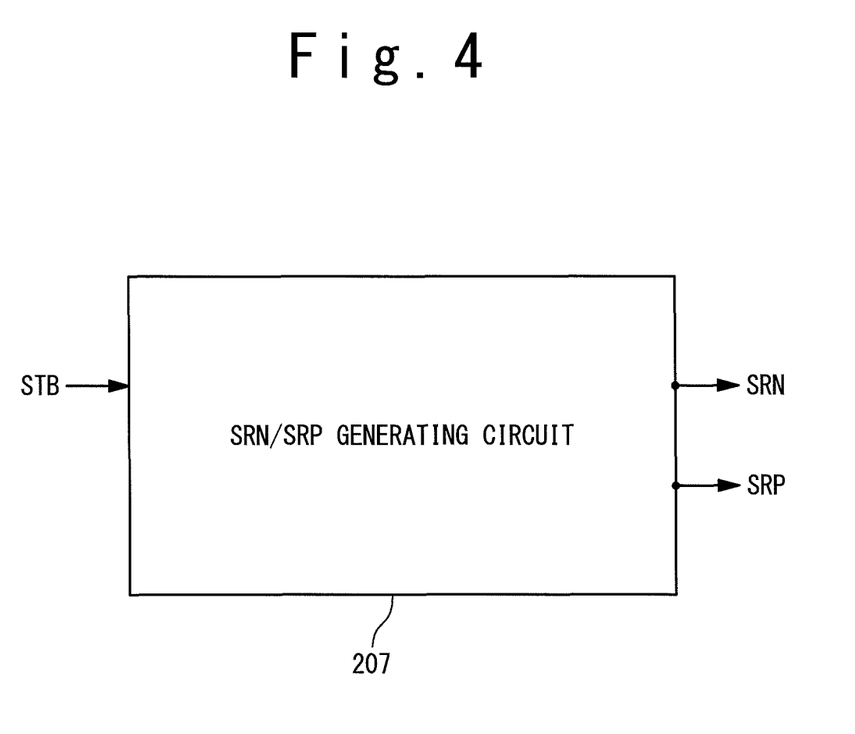
FIG. 4 is a diagram showing an SRN/SRP generating circuit according to the embodiment of the present invention.
Figure 5:
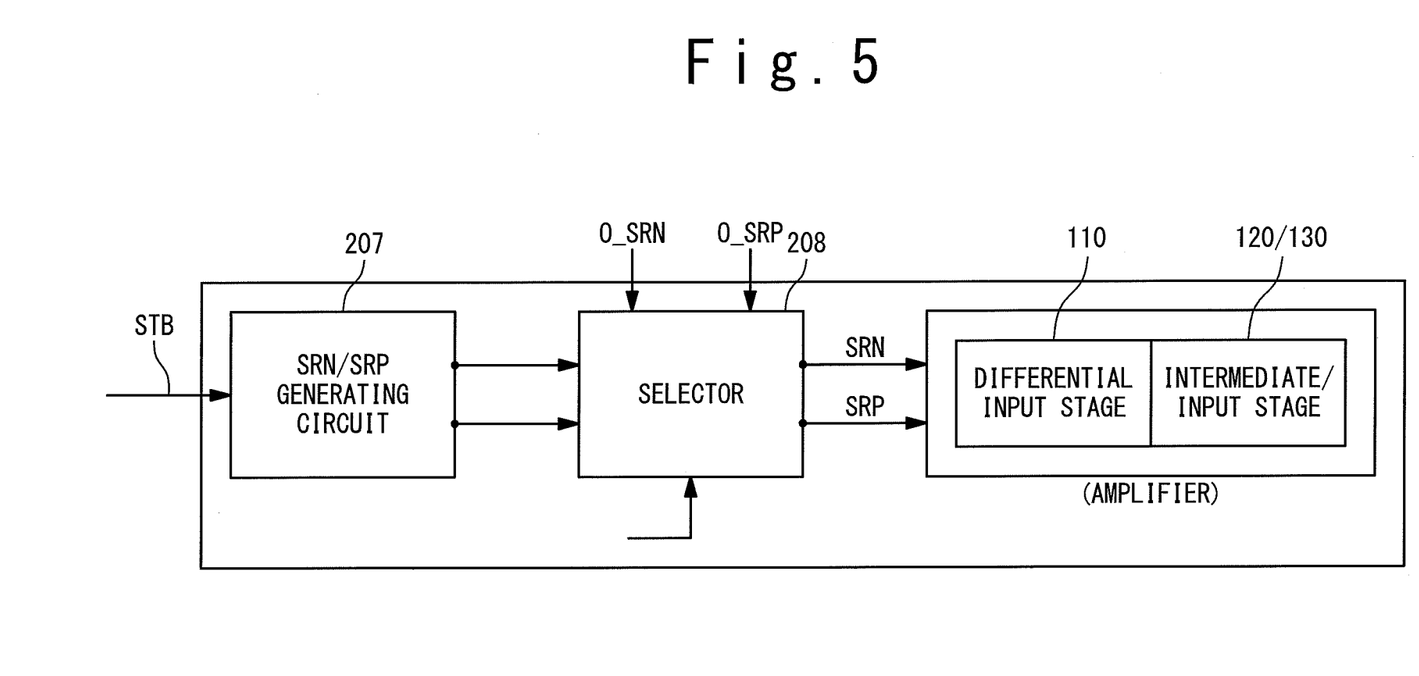
FIG. 5 is a diagram showing selection of a control signal SRN/SRP according to the embodiment of the present invention.

The power supply circuit 202 supplies reference voltages to the source drivers 203 and gate drivers 204. As shown in FIG. 4, the SRN/SRP generating circuit 207 generates the control signals SRN and SRP for a high slew rate based on a synchronization signal STB and supplies them to the source drivers 203 as the control signals. As shown in FIG. 5, if the control signals O_SRN and O_SRP for the high slew rate are supplied from the outside of the display control unit 201, a selector 208 may be provided to switch between the control signals generated by the SRN/SRP generating circuit 207 and the control signals O_SRN and O_SRP supplied from the outside.

The source driver 203 drives pixel lines of the liquid crystal panel 205 in a column direction based on the display data signal and the control signal. The gate driver 204 drives a pixel line of the liquid crystal panel 205 in a row direction based on the control signal.

Figure 6:
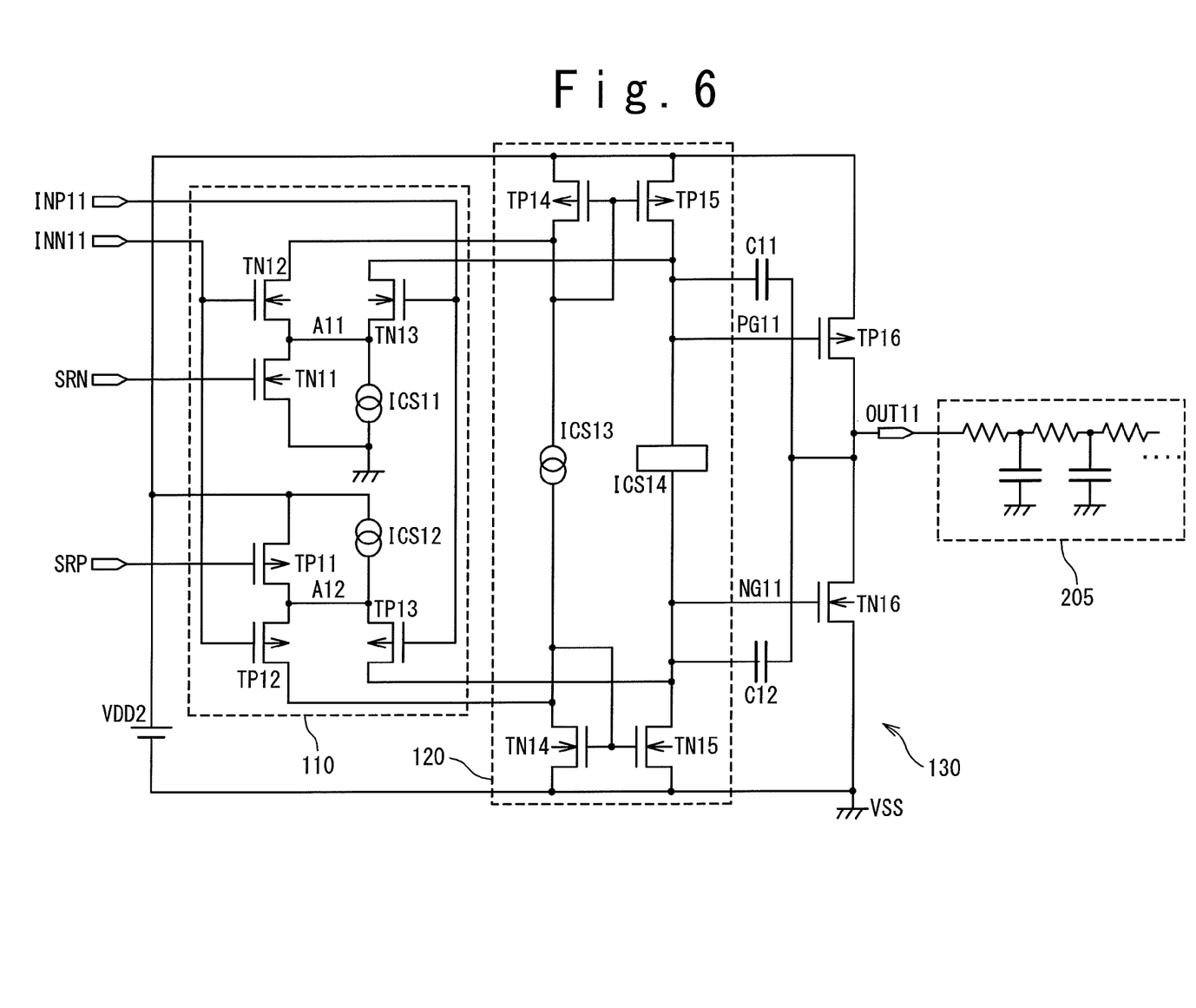
FIG. 6 is a circuit diagram showing the configuration of a differential amplifier according to the embodiment of the present invention.

FIG. 6 is a circuit diagram showing the configuration of a differential amplifier contained in the source driver 203. The differential amplifier is provided with an N-channel MOS transistors TN11 to TN16, P-channel MOS transistors TP11 to TP16, constant current sources ICS11 to ICS13, a floating constant current source ICS14, and phase compensation capacitors C11 and C12.

The differential input signal INP11 and INN11 is switched in logic level in synchronization with the synchronization signal STB and is supplied to the differential amplifier. The transistors TN12 and TN13 form a differential pair with the sources connected to each other (node A11). The gate of the transistor TN12 is connected with an inversion input terminal INN11 and the drain of the transistor TN12 is connected with a connection node between the drain of the transistor TP14 and the constant current source ICS13. The gate of the transistor TN13 is connected with a non-inversion input terminal INP11 and the drain of the transistor TN13 is connected with a connection node between the drain of the transistor TP15 and the floating constant current source ICS14. The transistor TN11 and the constant current source ICS11 are connected in parallel between the node A11 and the power supply voltage VSS. The control signal SRN is applied to the gate of the transistor TN11.

The transistors TP12 and TP13 form a differential pair with their sources connected to each other (node A12). The gate of the transistor TP12 is connected with the inversion input terminal INN11 and the drain of the transistor TP12 is connected with a connection node between the drain of the transistor TN14 and the constant current source ICS13. The gate of the transistor TP13 is connected with the non-inversion input terminal INP11 and the drain of the transistor TP13 is connected with a connection node between the drain of the transistor TN15 and the floating constant current source ICS14. The transistor TP11 and the constant current source ICS12 are connected in parallel between the node A12 and the power supply voltage VDD2. The control signal SRP is applied to the gate of the transistor TP11. The transistors TN11 to TN13, and TP11 to TP13 and the constant current sources ICS11 to ICS12 form a differential input stage 110.

The transistor TP14 and transistor TP15 whose gates are connected to each other are provided between the power supply voltage VDD2 and the constant current source ICS13 and between the power supply voltage VDD2 and the floating constant current source ICS14, respectively. The gates of the transistors TP14 and TP15 are connected with a connection node between the drain of the transistor TP14 and the constant current source ICS13 and the drain of the transistor TN12 is connected with the connection node.

The transistor TN14 and transistor TN15 whose gates are connected to each other are provided between the power supply voltage VSS and the constant current source ICS13 and between the power supply voltage VSS and the floating constant current source ICS14, respectively. The gates of the transistors TN14 and TN15 are connected with a connection node between the drain of the transistor TN14 and the constant current source ICS13 and the drain of the transistor TP12 is connected with the connection node. The transistors TP14 and TP15, and TN14 and TN15, the constant current source ICS13, the floating constant current source ICS14 form a middle stage 120.

The output stage 130 includes a transistor TP16 and a transistor TN16 which are connected in serial between the power supply voltage VDD2 and the power supply voltage VSS. The drains of the transistor TP16 and transistor TN16 are connected to each other and are connected with the output terminal OUT1. The phase compensation capacitors C11 and C12 are connected between the output terminal OUT1 and two nodes of the floating constant current source ICS14, respectively. The gate of the transistor TP16 is connected with the node PG11 between the drain of the transistor TP15 and the floating constant current source ICS14. The gate of the transistor TN16 is connected with the node NG11 between the drain of the transistor TN15 and the floating constant current source ICS14. The output OUT1 is connected with the liquid crystal panel 205.

Figure 7:
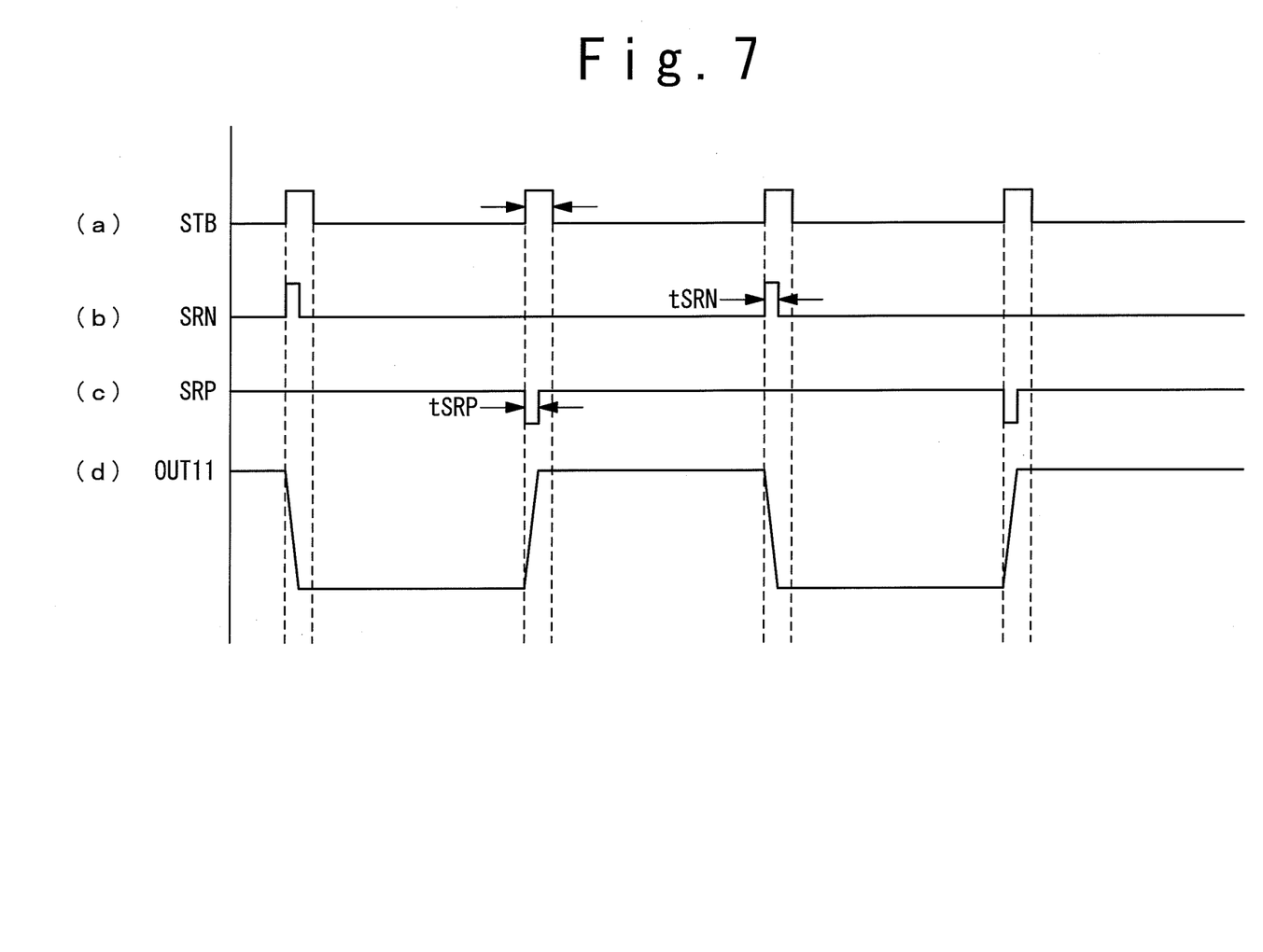
FIG. 7 shows voltage waveforms at various positions in an operation of the differential amplifier.

Next, referring to FIG. 7, an operation of the differential amplifier will be described. In the differential amplifier, the on/off states of the transistors TN11 and TP11 are controlled in response to the control signals SRN and SRP. The control signals SRN and SRP are signals having a voltage between the voltage VSS and the voltage VDD2 as an amplitude, as shown in (b) and (c) of FIG. 7. The control signals SRN and SRP include pulses which alternately takes the voltage VDD2 and the voltage VSS in response to the synchronization signal STB ((a) of FIG. 7). That is, the control signal SRN takes the voltage VSS in a steady state and contains pulses, each of which has the height of the voltage VDD2 and the width of a time period tSRN from the rising edge of the synchronization signals STB for every two pulses of the synchronization signal STB. The pulse width tSRN is shorter than the transition time of the differential signal and the transition time of the output signal OUT1. The control signal SRP takes the voltage VDD2 in a steady state and contains pulses, each of which has the height of the voltage VSS and the width of a time period tSRP from the rising edge of the synchronization signal STB for every two pulses of the synchronization signal STB. The pulse width tSRN is shorter than the transition time of the differential signal and the transition time of the output signal OUT1.

The state of the input terminal INP11 is switched in synchronization with the synchronization signal STB. Therefore, as shown in (d) of FIG. 7, the amplitude of the output terminal OUT11 of the differential amplifier is switched in synchronization with the synchronization signal STB. In the present invention, the transition is sped up by increasing the slew rate of the differential amplifier in an amplitude switching period. The control signal SRN and SRP are applied to the transistors TN11 and TP11 upon the switching.

That is, when the output terminal OUT11 of the differential amplifier is switched from the high voltage to the low voltage, the constant current source ICS11 is assisted (a larger amount of current flows) by the transistor TN11 turned on for the time period tSRN in response to the control signal SRN. The large amount of current flows so that the differential amplifier is set to the high slew rate. As a specific voltage change, the voltage of the connection node A11 between the differential pair of the transistors TN12 and TN13 and the constant current source ICS11 converges to a voltage near to the power supply voltage VSS.

When the output terminal OUT11 of the differential amplifier switches from the low voltage to the high voltage, the constant current source ICS12 is assisted (a large amount of current flows) by the transistor TP11 turned on during the time period tSRP in response to the control signal SRP. Because the large amount of current flows, the differential amplifier is set to a high slew rate. As a specific voltage change, the voltage at the connection node A1t between the differential pair of the transistors TP12 and TP13 and the constant current source ICS12 converges to a voltage in the neighborhood of the power supply voltage VDD2.

There is an enough effect even if the device sizes of the transistors TN11 and TP11 are a minimum size used for the high slew rate. The adjustment of the time period for changing the slew rate can be performed based on the pulse widths of the control signals SRN and SRP. Also, the control signals SRN and SRP are common to the source drivers 203, and the pair of the signals is generated by the SRN/SRP generating circuit 207. The generation is simply performed by using the synchronization signal STB and there are few influences on the circuit area. Therefore, there is no influence on the circuit area of the IC chip in which the SRN/SRP generating circuit 207 is incorporated.

There is no generation of ringing or oscillation of the differential amplifier during the transition time for switching the amplitude of the output of the differential amplifier, since the pulse widths of the control signals SRN and SRP are as short as 1 μs and the amplitudes of the control signals are from VDD2 to VSS, while the conventional adjustment times tbp1 and tbn1 of the slew rate are 10 μs.

Figure 8:
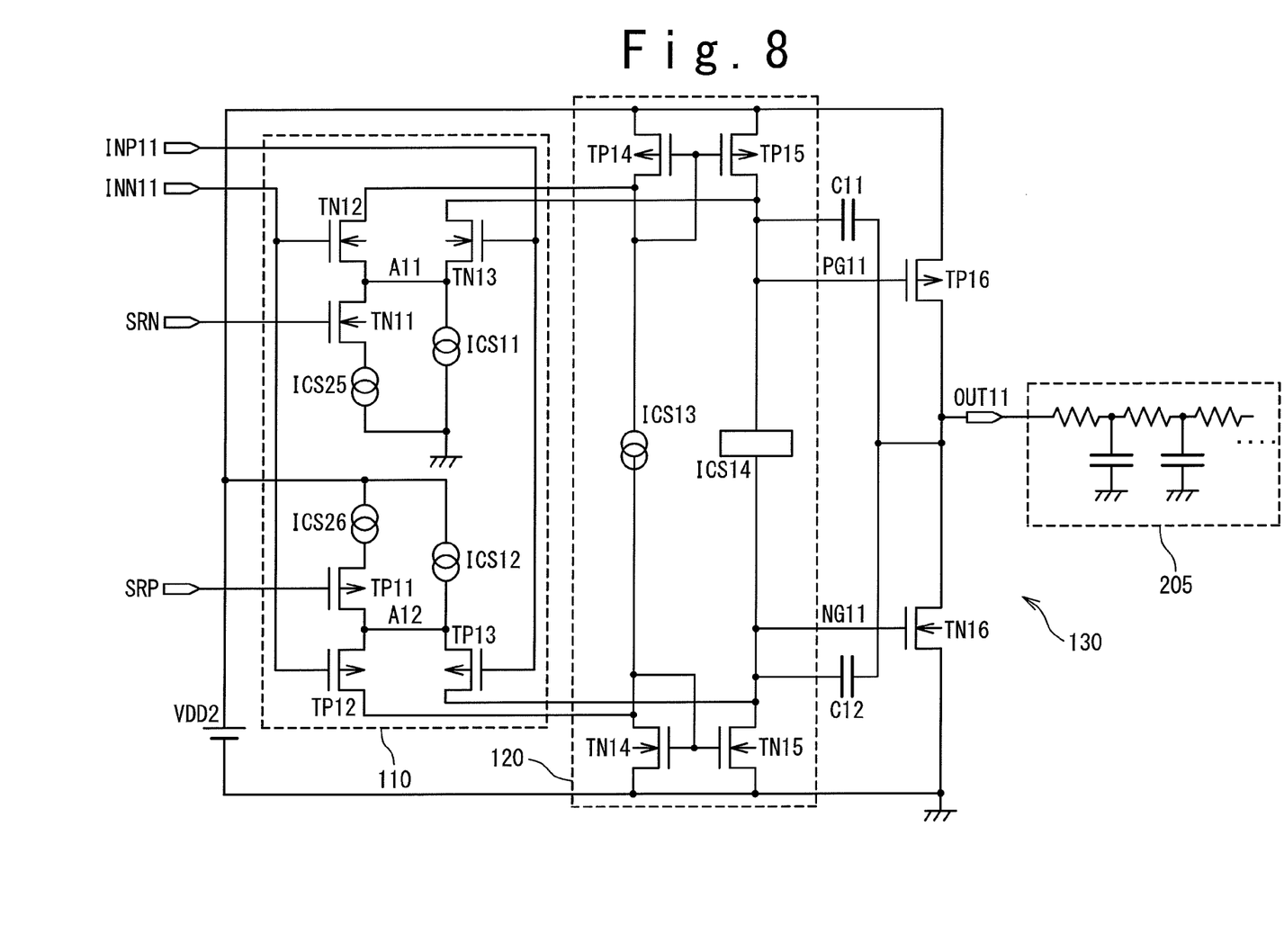
FIG. 8 is a circuit diagram showing the configuration of the differential amplifier according to another embodiment of the present invention.

As shown in FIG. 8, a constant current source ICS25 may be inserted between the source of the transistor TN11 and the power supply voltage VSS, and a constant current source ICS26 may be inserted between the source of the transistor TP11 and the power supply voltage VDD2.

In this way, when the transistors TN11 and TP11 are respectively turned on in response to the control signals SRN and SRP, the constant current sources ICS25 and ICS26 function to increase the currents. At this time, if the current values of the constant current sources are set to meet the relations (current of ICS25)>>(current of ICS11) and (current of ICS26)>>(current of ICS12), the effect of the high slew rate is great. When the transistors TN11 and TP11 are turned off in response to the control signals SRN and SRP which are generated based on the synchronization signal STB, that is, when the switching is ended, the current for the high slew rate is stopped so that the current values of the constant current sources ICS25 and ICS26 do not almost influence the increase of the power supply current of the whole circuit even if they are set to the large values.

In this way, in the differential input stage 110, the transistor TN11 is connected in parallel to the constant current source ICS11 and the transistor TP11 is connected in parallel to the constant current source ICS12. The control signal SRN is supplied to the gate of the transistor TN11 to control the on/off state of the transistor TN11. The control signal SRP is supplied to the gate of the transistor TP11 to control the on/off state of the transistor TP11. The amplitudes of the control signals SRN and SRP are in a range of VSS to VDD2 which is the same as in the differential amplifier. Each control signal is synchronous with the rising edge for every two pulses of the synchronization signal STB which indicates the inversion of the amplifier output. The control signals SRN and SRP may be freely supplied from the outside.

When the output terminal OUT11 of the differential amplifier is switched from the high voltage to the low voltage, the transistor TN11 is turned on for a moment in response to the control signal SRN to assist in (flow of a large amount of current) the constant current source ICS11. Thus, the differential amplifier is set to the high slew rate. When the output terminal OUT11 of the differential amplifier is switched from the low voltage to the high voltage, the transistor TP11 is turned on for a moment in response to the control signal SRP to assist in (flow of a large amount of current) the constant current sources ICS12. Thus, the differential amplifier is set to the high slew rate.

There is an enough effect even if the device sizes of the transistors TN11 and TP11 which are used for the high slew rate is minimum. The time period during which the slew rate is adjusted can be controlled based on the pulse widths of the control signals SRN and SRP. Also, the control signal SRN or SRP is a 1-shot pulse which is synchronization with the synchronization signal STB and is sufficient for one signal to be provided over the source drivers IC. Moreover, the control signals SRN and SRP can be simply generated in the IC by using synchronization signal STB, and there are few influences over the increase of the chip area.

When one period of the STB signal is about 15 μs, there is an effect of the high slew rate even if the pulse widths of the control signals SRN and SRP are about 100 ns. The slew rate of an ordinary source driver is about 3 μs and the pulse width is desirable to be set equal to or shorter than the pulse width of about 3 μs. In this way, because the operation is for a short time period and the amplitude is in the range of VDD2 to VSS, a time period during which a bias current is stable can be made longer, so that the ringing operation and oscillating operation of the differential amplifier can be prevented.

In this way, the slew rate of the differential amplifier can be controlled by finely controlling the pulse widths of the control signals SRN and SRP. The high slew rate operation of the differential amplifier can be attained only by providing a simple common circuit to generate the control signals in synchronous with the display timing and by adding a small amount of parts to the differential amplifier. In such a circuit configuration, because it is not a control of a feedback loop type, the stability of the differential amplifier is improved. Therefore, the ringing operation and oscillation of the differential amplifier can be prevented. Also, a current of the constant current source of the differential input stage in the steady state can be reduced and it is not necessary to make the phase compensation capacitance small. That is, the differential amplifier with the improved slew rate can be provided while keeping the stability, without increasing a consumption current amount.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A differential amplifier comprising:
   a first differential pair of transistors configured to receive a differential input signal;
   a first constant current source connected with said first differential pair of transistors;
   a first switch connected in parallel with said first constant current source and configured to increase current which flows through said first differential pair of transistors, in response to a first control signal which is active for a first time period in a level transition of an output signal of the differential amplifier corresponding to a switching of a state of the differential input signal,
   a second differential pair of transistors configured to receive said differential input signal;
   a second constant current source connected with said second differential pair of transistors; and
   a second switch connected in parallel with said second constant current source and configured to increase current which flows through said second differential pair of transistors, in response to a second control signal which is active for the second time period in a level transition of the output signal corresponding to a switching of a state of the differential input signal,
   wherein the first time period in a level transition of the output signal is a time period during a transition of said output signal from a high voltage to a low voltage,
   wherein the first control signal is not active for a second time period in a level transition of the output signal of the differential amplifier corresponding to a switching of a state of the differential input signal,
   wherein the second time period in a level transition of the output signal is a time period during a transition of said output signal from a low voltage to a high voltage,
   wherein initialization of rising and falling edges of the level transition of the output signal of the differential amplifier corresponding to a switching of a state of the differential input signal occurs in synchronization with initialization of rising edges of a synchronization signal,
   wherein initialization of falling edges of the first control signal occurs in synchronization with initialization of both rising edges of one of even and odd pulses of the synchronization signal and rising edges of the output signal,
   wherein initialization of rising edges of the second control signal occurs in synchronization with initialization of both rising edges of the other of said even and odd pulses of the synchronization signal and falling edges of the output signal,
   wherein the second control signal is not active for the first time period in a level transition of the output signal of the differential amplifier corresponding to a switching of a state of the differential input signal, and
   wherein said first and second time periods are shorter than each of pulses of said synchronization signal.

2. The differential amplifier according to claim 1, wherein said first switch and said second switch alternately increase the currents which flow through said first differential pair of transistors and said second differential pair of transistors in synchronization with different level transitions of said differential input signal, respectively.

3. The differential amplifier according to claim 2, wherein said first differential pair of transistors comprises two N-channel MOS transistors having gates supplied with said differential input signal and sources connected to each other and drains connected with a positive power supply voltage through an active load,
   wherein said first switch comprises an N-channel MOS transistor having a drain connected with the sources of said two N-channel MOS transistors, a source connected with a negative power supply voltage and a gate applied with said first control signal,
   wherein said second differential pair of transistors comprises two P-channel MOS transistors having gates supplied with said differential input signal, sources connected to each other, and drains connected with the negative power supply voltage through an active load, and
   wherein said second switch comprises:
      a P-channel MOS transistor having a drain connected with the sources of said two P-channel MOS transistors, a source connected with the positive power supply voltage, and a gate supplied with said second control signal.

4. The differential amplifier according to claim 3, further comprising:
   a third constant current source connected in serial with said first switch such that a serial connection of said first switch and said third constant current source is connected in parallel with said first constant current source: and
   a fourth constant current source connected in serial with said second switch such that a serial connection of said second switch and said fourth constant current source is connected in parallel with said second constant current source.

5. The differential amplifier according to claim 3, wherein each of said first and second control signals has a voltage between said positive power supply voltage and said negative power supply voltage as an amplitude.

6. The differential amplifier according to claim 3, wherein said N-channel MOS transistor and said P-channel MOS transistor are formed in a minimum size of a design rule.

7. A liquid crystal display apparatus, comprising:
   a signal generating circuit configured to generate a first control signal and a second control signal; and
   a differential amplifier,
   wherein said differential amplifier comprises:
   a first differential pair of transistors configured to receive a differential input signal;
   a first constant current source connected with said first differential pair of transistors; and
   a first switch connected in parallel with said first constant current source and configured to increase current which flows through said first differential pair of transistors, in response to said first control signal which is active for a first time period in a level transition of an output signal of the differential amplifier corresponding to a switching of a state of the differential input signal,
a second differential pair of transistors configured to receive said differential input signal;
a second constant current source connected with said second differential pair of transistors; and
a second switch connected in parallel with said second constant current source and configured to increase current which flows through said second differential pair of transistors, in response to said second control signal which is active for the second time period in a level transition of the output signal corresponding to a switching of a state of the differential input signal,
wherein the first time period in a level transition of the output signal is a time period during a transition of said output signal from a high voltage to a low voltage,
wherein the first control signal is not active for a second time period in a level transition of the output signal of the differential amplifier corresponding to a switching of a state of the differential input signal,
wherein the second time period in a level transition of the output signal is a time period during a transition of said output signal from a low voltage to a high voltage,
wherein initialization of rising and falling edges of the level transition of the output signal of the differential amplifier corresponding to a switching of a state of the differential input signal occurs in synchronization with initialization of rising edges of a synchronization signal,
wherein initialization of falling edges of the first control signal occurs in synchronization with initialization of both rising edges of one of even and odd pulses of the synchronization signal and rising edges of the output signal,
wherein initialization of rising edges of the second control signal occurs in synchronization with initialization of both rising edges of the other of said even and odd pulses of the synchronization signal and falling edges of the output signal,
wherein the second control signal is not active for the first time period in a level transition of the output signal of the differential amplifier corresponding to a switching of a state of the differential input signal, and
wherein said first and second time periods are shorter than each of pulses of said synchronization signal.

8. The liquid crystal display apparatus according to claim 7, wherein said first switch and said second switch alternately increase the currents which flow through said first differential pair of transistors and said second differential pair of transistors in synchronization with different level transitions of said differential input signal, respectively.

9. The liquid crystal display apparatus according to claim 8, wherein said first differential pair of transistors comprises two N-channel MOS transistors having gates supplied with said differential input signal and sources connected to each other and drains connected with a positive power supply voltage through an active load,
wherein said first switch comprises an N-channel MOS transistor having a drain connected with the sources of said two N-channel MOS transistors, a source connected with a negative power supply voltage and a gate applied with said first control signal,
wherein said second differential pair of transistors comprises two P-channel MOS transistors having gates supplied with said differential input signal, sources connected to each other, and drains connected with the negative power supply voltage through an active load, and wherein said second switch comprises:
P-channel MOS transistor having a drain connected with the sources of said two P-channel MOS transistors, a source connected with the positive power supply voltage, and a gate supplied with said second control signal.

10. The liquid crystal display apparatus according to claim 9, wherein said differential amplifier further comprises:
a third constant current source connected in serial with said first switch such that a serial connection of said first switch and said third constant current source is connected in parallel with said first constant current source; and
a fourth constant current source connected in serial with said second switch such that a serial connection of said second switch and said fourth constant current source is connected in parallel with said second constant current source.

11. The liquid crystal display apparatus according to claim 9, wherein each of said first and second control signals has a voltage between said positive power supply voltage and said negative power supply voltage as an amplitude.

12. The liquid crystal display apparatus according to claim 9, wherein said N-channel MOS transistor and said P-channel MOS transistor are formed in a minimum size of a design rule.

13. A control method of a differential amplifier, comprising:
receiving a differential input signal by a first differential pair of transistors;
holding current which flows through said first differential pair of transistors at a constant current; and
increasing the current which flows through said first differential pair of transistors, in response to a first control signal which is active for a first time period in a level transition of an output signal of the differential amplifier corresponding to a switching of a state of the differential input signal,
receiving said differential input signal by a second differential pair of transistors;
holding current which flows through said second differential pair of transistors at a constant current;
increasing the current which flows through said second differential pair of transistors, in response to a second control signal which is active for a second time period in a level transition of the output signal corresponding to a switching of a state of the differential input signal,
activating said first and second time periods which are shorter than each of pulses of a synchronization signal,
wherein the first time period in a level transition of the output signal is a time period during a transition of said output signal from a high voltage to a low voltage,
wherein the first control signal is not active for a second time period in a level transition of the output signal of the differential amplifier corresponding to a switching of a state of the differential input signal,
wherein the second time period in a level transition of the output signal is a time period during a transition of said output signal from a low voltage to a high voltage,
wherein initialization of rising and falling edges of the level transition of the output signal of the differential amplifier corresponding to a switching of a state of the differential input signal occurs in synchronization with initialization of rising edges of a synchronization signal,
wherein initialization of falling edges of the first control signal occurs in synchronization with initialization of both rising edges of one of even and odd pulses of the synchronization signal and rising edges of the output signal,
wherein the second control signal is not active for the first time period in a level transition of the output signal of the differential amplifier corresponding to a switching of a state of the differential input signal, and
wherein said first and second time periods are shorter than each of pulses of said synchronization signal.

* * * * *